(12) United States Patent
Yoo

(10) Patent No.: US 6,825,694 B2
(45) Date of Patent: Nov. 30, 2004

(54) FLIP-FLOP CIRCUIT FOR USE IN ELECTRONIC DEVICES

(75) Inventor: Seung-Moon Yoo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/255,468

(22) Filed: Sep. 26, 2002

(65) Prior Publication Data

US 2004/0061531 A1 Apr. 1, 2004

(51) Int. Cl.[7] .............................................. H03K 19/096
(52) U.S. Cl. ....................................... 326/95; 326/121
(58) Field of Search ......................... 326/95, 98, 121; 327/208, 212, 200

(56) References Cited

U.S. PATENT DOCUMENTS 5,796,282 A * 8/1998 Sprague et al. ............. 327/210

6,496,038 B1 * 12/2002 Sprague et al. ............... 326/95

* cited by examiner

Primary Examiner—Daniel D. Chang
(74) Attorney, Agent, or Firm—Joseph P. Lally; Casimer K. Salys

(57) ABSTRACT

A flip-flop circuit that includes a set of three p-channel connectors connected in parallel between a supply voltage (Vdd) and a first control node. The circuit further includes three n-channel transistors connected in series between the first control node and Vss. The first control node controls the gate of a p-channel transistor connected between Vdd and an output node. A set of n-channel transistors is connected between the output node and ground. The gates of these transistors are controlled by the clock signal, a delayed clock signal, and an inverted copy of the data signal, which is provided, via a control inverter, to a second control node. The first control node drives the output node to a first state and the second control node drives the output node to a second state. The first and second control nodes are preferably decoupled.

19 Claims, 4 Drawing Sheets

FLIP-FLOP CIRCUIT FOR USE IN ELECTRONIC DEVICES

BACKGROUND

1. Field of the Present Invention

The present invention generally relates to the field of electronic circuits and more particularly to digital flip-flop circuits.

2. History of Related Art

Flip-flop circuits are well known in the field of digital electronics. Referring to FIG. 1, a typical flip-flop circuit 100 is depicted. Flip-flop circuit 100 is configured to receive a clock input (C) on a clock input node 122 and a data input (D) on a data input node 123. Circuit 100 is further configured to produce a pair of complementary digital output signals comprising an output signal (Q) on an output node 126 and its logical complement output signal (QB) on output node 128.

The operation of circuit 100 will be described with reference to FIGS. 1 through 4 where FIGS. 2, 3, and 4 are equivalent circuit representations of circuit 100 under various states and where "on" transistors are replaced with a source-to-drain short and "off" transistors are replaced with a source-to-drain open. As depicted in FIG. 1, circuit 100 includes n-channel transistors 101 through 106, p-channel transistors 107 through 110, and inverters 112, 114, 116, and 118. The p-channel transistors 107 through 109 are connected between Vdd and a control node 120 and their gate terminals are controlled by clock signal C, data signal D, and signal CBD respectively. The n-channel transistors 101 through 103 form a series connection between control node 120 and Vss or ground while their gate terminals are also controlled by signals C, D, and CBD respectively. The n-channel transistors 104, 105, and 106 form a series connection between output node 126 and Vss with their gates controlled by clock signal C, a control node 120, and signal CBD respectively.

When clock signal C is low (steady state) as represented in FIG. 2, p-channel transistor 107 turns on and pulls control node 120 high. When clock signal C subsequently transitions from low to high (FIG. 3), the state of control node 120 is determined by the state of input signal D for a duration or interval referred to herein as the clocking duration or clocking interval. The length of the clocking interval is determined by the series combination of inverters 112 through 116. The low to high transition of signal C ripples through inverters 112 through 116 to produce on node 124 a high-to-low transition on a signal identified as CBD (C Bar Delayed), which is a time-delayed complement of clock signal C. When the transition of clock signal C ripples through to node 124, CBD transitions low. When CBD is low (FIG. 4), p-channel transistor turns on 109 and pulls control node 120 high. Thus, the series inverters 112 through 116 produce a clocking interval window during which C and CBD are both high following a low-to-high transition of clock signal C.

Returning to FIG. 3, which represents the state of circuit 100 during the clocking interval, if D is low, p-channel transistor 108 will turn on thereby maintaining control node 120 in its high state. If D is high, p-channel transistors 107, 108, and 109 are cut off and n-channel transistors 101 through 103 are turned on. In this state, control node 120 will be pulled low. Because, however, control node 120 is connected to the capacitive gate terminals of two transistors (105 and 110) and to the series resistance of transistors 101 through 103, there will be an inherent delay associated with the high to low transition of control node 120. Moreover, because control node 120 is connected to the gate electrode of the output transistor pair (transistor 105 and transistor 110), any delay in the transition of control node 120 is propagated to output nodes 126 and 128 thereby negatively impacting performance. In addition, it will be apparent that the rise time and fall time associated with the depicted circuit configuration are unequal or asymmetrical because of the relatively long time it takes control node 120 to transition low. Asymmetrical timing in digital circuits is typically undesirable because timing requirements are typically understood to be independent of the data. It would be desirable, therefore, to implement a flip-flop circuit that achieved substantially symmetrical performance at low power and without a significant increase over the cost, complexity, and size of the circuit 100.

SUMMARY OF THE INVENTION

The problems identified above are in large part addressed by a flip-flop circuit according to the present invention in which a clock signal and a data input signal are received and a corresponding output produced. The circuit includes a set of series inverters connected to the clock signal to produce a delayed and complementary copy of the clock signal. The circuit further includes a set of three p-channel connectors connected in parallel between a supply voltage (Vdd) and a control node. The p-channel transistor gates are driven by the clock signal, the data signal, and the delayed signal. The circuit further includes three n-channel transistors connected in series between the control node and Vss and gated by clock signal C, data signal D, and the delayed signal. The control node controls the gate of a fourth p-channel transistor connected between Vdd and an output node. A set of three n-channel transistors is connected between the output node and ground. The gates of these transistors are controlled by the clock signal, the delayed signal, and an inverted copy of the data signal, which is provided directly to one of these output transistors via a control inverter. In one embodiment, the n-channel transistor string between the control node and ground and the n-channel transistor string between the output node and ground may share a common transistor having a W/L roughly twice that of the other n-channel devices. The output node may be connected to a stabilization circuit to improve noise immunity.

BRIEF DESCRIPTION OF THE DRAWINGS

Other objects and advantages of the invention will become apparent upon reading the following detailed description and upon reference to the accompanying drawings in which.

Figure 1:
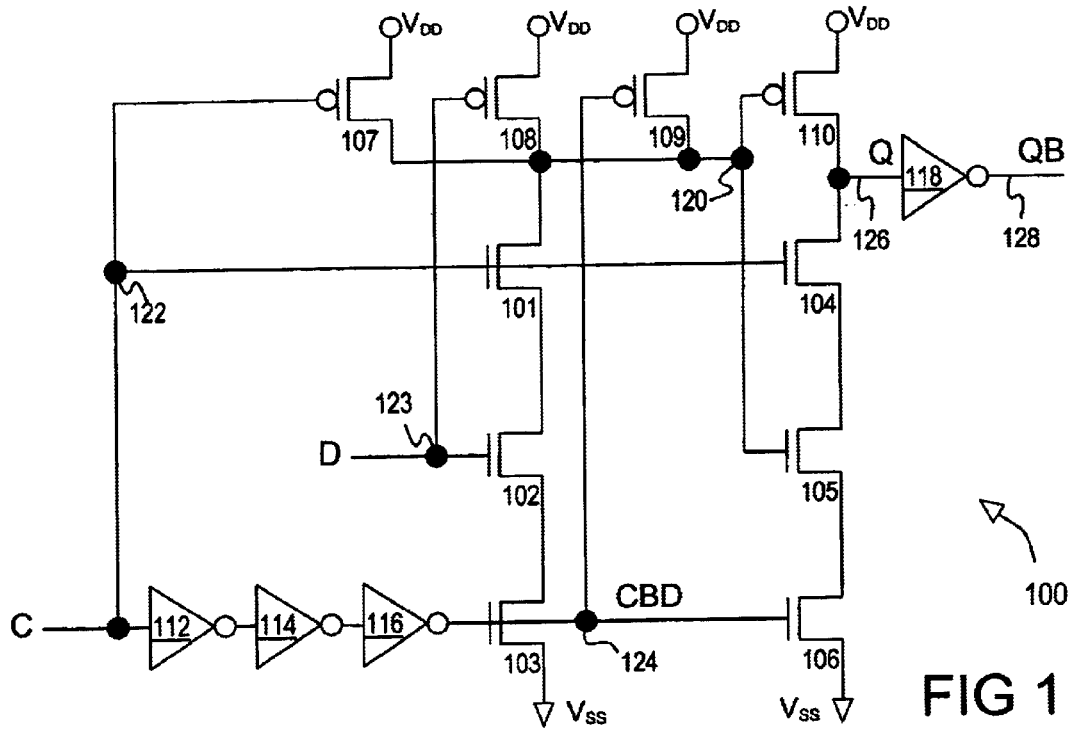
FIG. 1 is a circuit diagram of a conventional flip-flop circuit.
Figure 2:
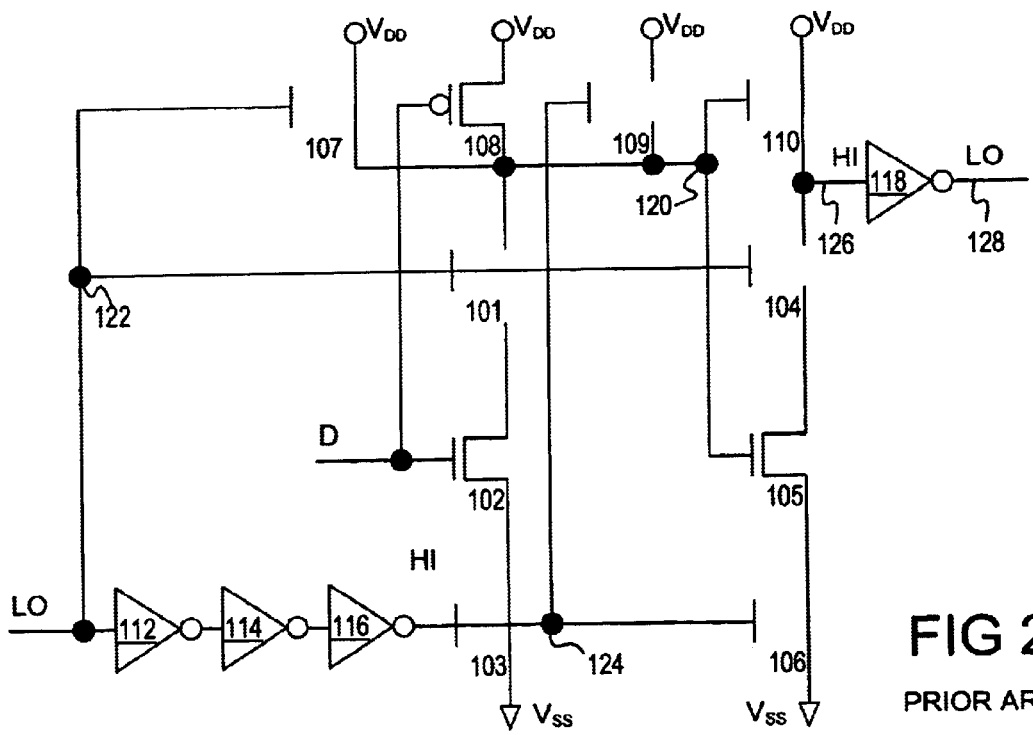
FIG. 2 is an equivalent circuit representation of the circuit of FIG. 1 when the clock signal has been deasserted.
Figure 3:
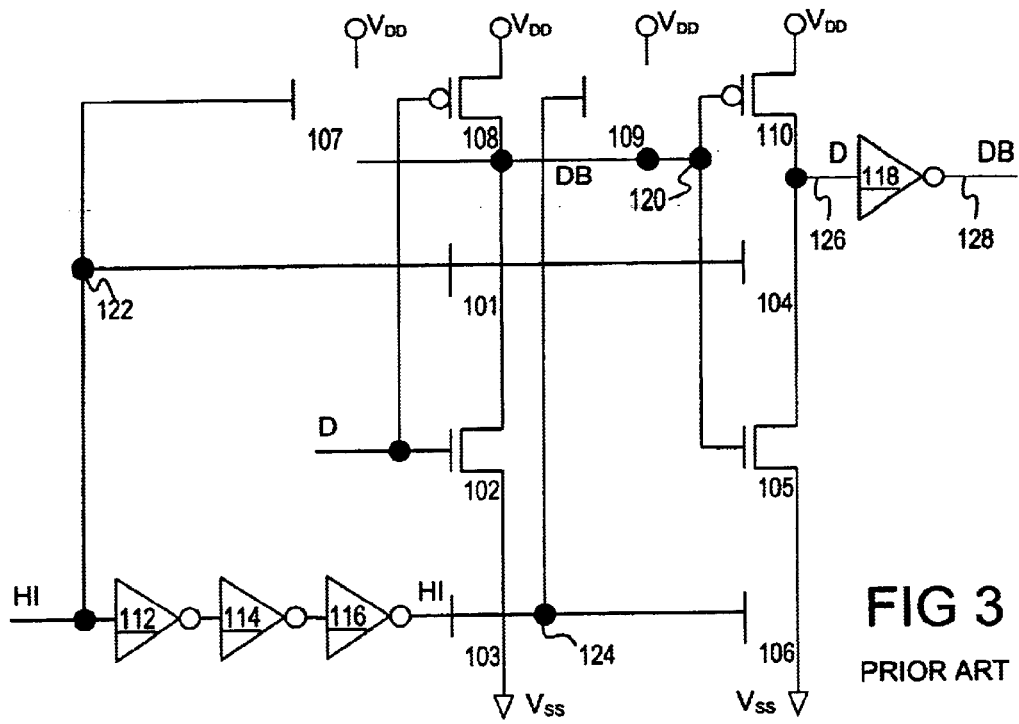
FIG. 3 is an equivalent circuit representation of the circuit of FIG. 1 shortly after a transition of the clock signal from low to high.
Figure 4:
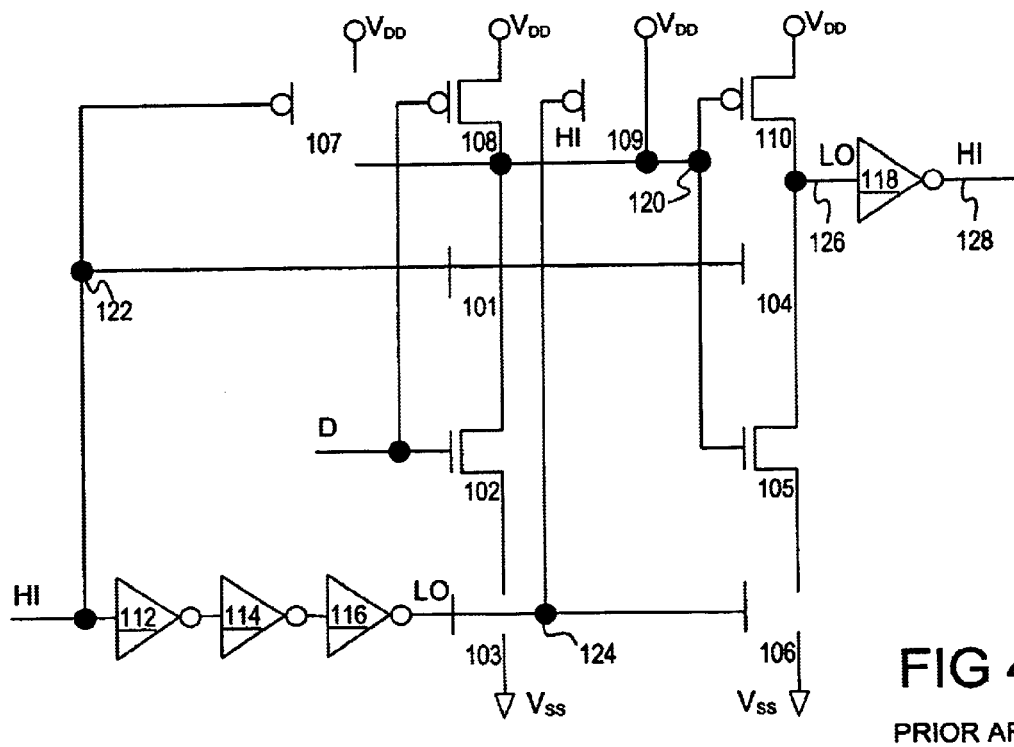
FIG. 4 is an equivalent circuit representation of the circuit of FIG. 1 after the clock signal transition has propagated through the series inverter path.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

The invention is generally directed at a flip-flop circuit characterized by symmetrical timing, high performance, low power, and minimized size. The circuit includes an output transistor pair that determines that state of the circuit output. The output transistor pair is controlled by a first control node when the output is to be driven high and a second control node when the output is to be driven low. The first and second control nodes are preferably distinct or decoupled from one another such that capacitive loading associated with the first control node does not affect the second node and vice versa.

Figure 5:
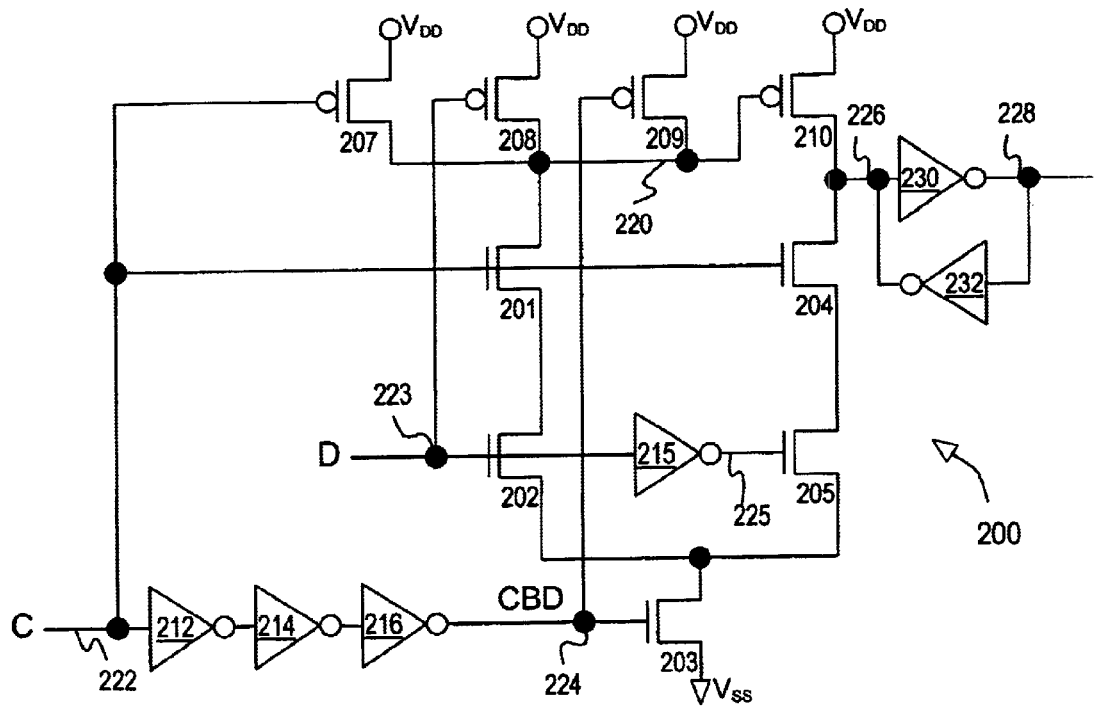
FIG. 5 is a flip-flop circuit according to one embodiment of the present invention.

Referring now to FIG. 5, a flip-flop circuit 200 according to one embodiment of the present invention is depicted. Flip-flop circuit 200 is suitable for use in a wide variety of digital devices. Flip-flop circuit 200 is typically implemented as a part of an integrated circuit or module that contains other digital logic to achieve a desired logic design. Such an integrated circuit itself typically comprises one of multiple such modules of an electronic device.

As depicted in FIG. 5, circuit 200 includes n-channel transistors 201 through 205, p-channel transistors 207 through 210, a control inverter 215, a set of pulse width inverters 212, 214, and 216, and a pair of stabilizing inverters 230 and 232. Circuit 200 is configured to receive a clock signal C on a clock input node 222 and a data signal D on a data input node 223. A set of inverters 212, 214, and 216, arranged in series, receive the clock signal C and generate a delayed signal CBD, which is a time-delayed, and logically complementary copy of the clock signal) on node 224.

The source/drain terminals of p-channel transistors (also referred to as precharge transistors) 207, 208, and 209 are connected between a supply voltage Vdd and control node 220 while the gates of these transistors are connected to clock signal C, data signal D, and signal CBD respectively. The source/drain terminals of n-channel transistors (also referred to herein as control node transistors) 201, 202, and 203 are connected in series between control node 220 and a second supply voltage (Vss or ground) while the gate terminals of these transistors are connected to clock signal C, data signal D, and signal CBD respectively. The source/drain terminals of n-channel transistors 205, 204, and 203 (also referred to as second, third, and fourth output transistors, respectively) are connected in series between output node 226 and the second supply voltage while the gate terminals for these transistors are connected to the logical complement of data signal D, clock signal C, and signal CBD respectively. The input of control inverter 215 is connected to data node 223 to receive the data input signal D while its output is connected to a second control node 225, which is connected to the gate terminal of n-channel transistor 205.

Figure 6:
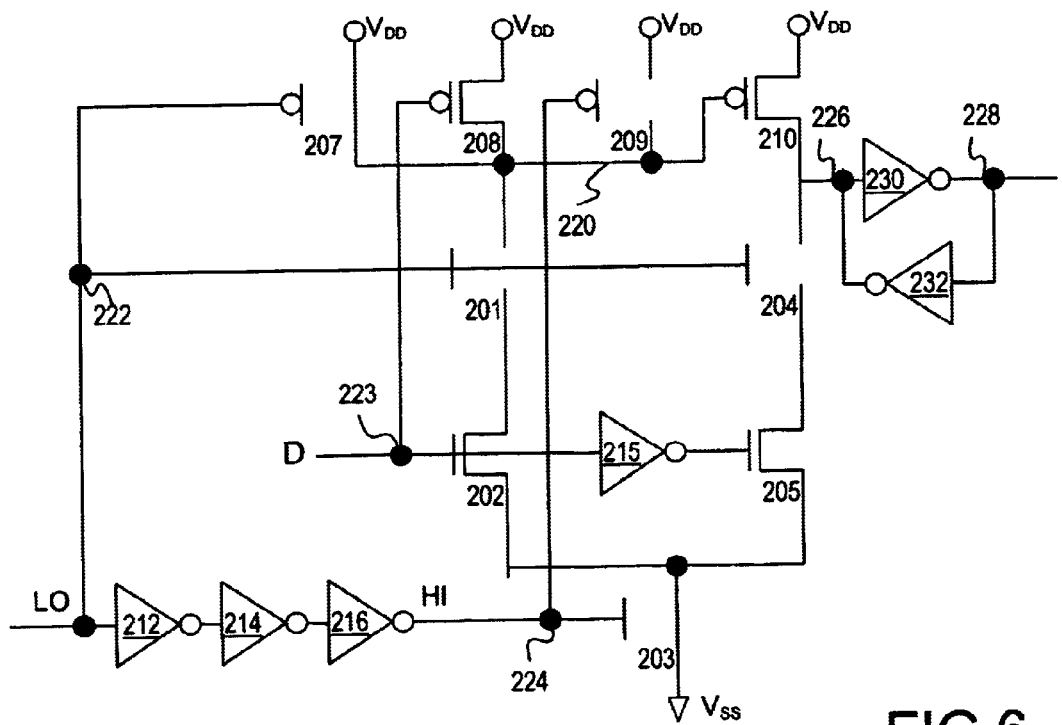
FIG. 6 is an equivalent circuit representation of the circuit of FIG. 5 in its precharge state with the clock signal deasserted.
Figure 7:
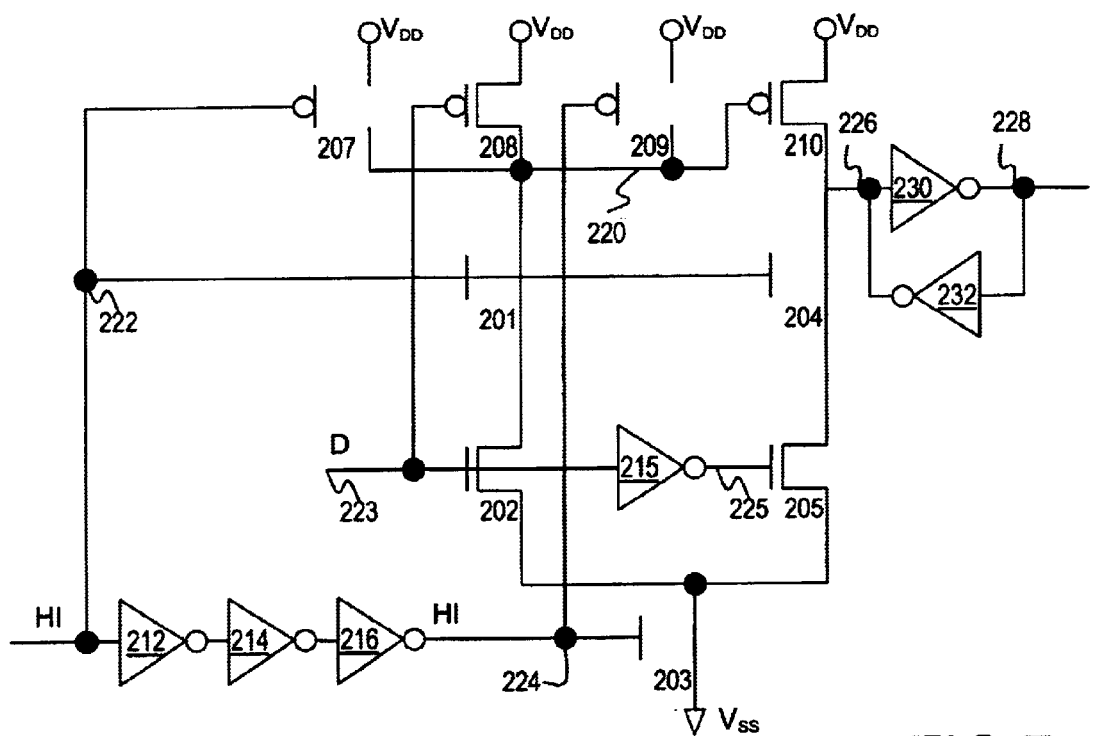
FIG. 7 is an equivalent circuit representation of the circuit of FIG. 5 shortly after assertion of the clock signal.

In operation, a first control node 220 of circuit 200 is precharged high, via p-channel transistor 207, when clock signal C is low as depicted in FIG. 6. With control node 220 high, p-channel transistor (or first output transistor) 210 and n-channel transistor 204 are both cut-off thereby isolating output node 226. After clock signal C transitions high, but before node 224 transitions low via inverters 212, 214, and 216, circuit 200 operates as the equivalent circuit depicted in FIG. 7 with p-channel transistors 207 and 209 cut off and n-channel transistors 203 and 204 on. If input signal D is low, control node 220 is tied high by p-channel transistor 208 thereby maintaining p-channel transistor 210 in cut-off. Because control node 220 is precharged high, there is substantially no delay required to transition control node 220 to the high state from the precharge state. The low input signal D is inverted by control inverter 215 to turn on n-channel transistor (or second output transistor) 205 thereby completing the path from output node 226 to Vss. In this manner, second output transistor 205 forces output node 226 to a low state (the second state) in response to a low D signal. Because no transition time is required to cut off p-channel transistor 210, it will be appreciated that the fall time of node 226 is primarily dependent upon the amount of time required to discharge node 226 through the series resistance represented by transistors 203, 204, and 205.

If data signal D is high when the clock signal transitions high, p-channel transistors 207, 208, and 209 are all cut-off (until transistor 209 turns back on after the clocking interval) and transistors 201, 202, and 203 are turned on thereby permitting control node 220 to discharge and assume a low state. In this state, first output transistor 210 is turned on thereby forcing output node 226 to a high state. The discharge of control node 220 is improved over (faster than) circuit 100 as depicted in FIG. 1 because of reduced capacitive loading on the node. More specifically, the first control node 220 of circuit 200, which turns on to force output node to a first state, and the second control node 225, which turns on to force output node 226 to a second state, are decoupled from one another. Because control node 220 is connected to the gate terminal of just a single transistor (first output transistor 210), there is less capacitive loading on control node 220 than on control node 120 of FIG. 1, which is connected to a complementary pair of output transistors (110, 105). This reduction in capacitive loading beneficially improves or reduces the fall time of node 220 and improves the overall performance of circuit 200. To further benefit performance, the transistor 203 of circuit 200, which replaces a pair of transistors 103 and 106 in circuit 100 of FIG. 1, has a W/L ratio roughly twice that of transistors 201 and 202. The larger ratio of transistor 203 is able to accommodate greater current and represents less resistance in the path between control node 220 and ground. Because the larger transistor 203 replaces a pair of smaller transistors, the reduced resistance is achieved at little or no increase in area. Thus, by reducing the capacitive loading on control node 220 and reducing the effective resistance between control node 226 and Vss, circuit 200 achieves more symmetrical output behavior and improved performance in the case where D is high at the cost of just a single additional CMOS inverter (215). The size of this inverter is typically sufficiently small to justify its inclusion in the circuit.

Circuit 200 beneficially reduces power consumption relative to circuit 100 of FIG. 1. In circuit 100, transistors 110, 104, 105, and 106 may all be for a time following a low to high transistor of the clock signal when D is high. When the clock signal goes high in circuit 100, transistor 104 turns on. Transistor 106 remains turned on until CBD transitions low in response to the clock signal going high. With the data signal high, node 120, which was precharged high, begins to discharge through transistors 101 through 103. When the voltage on control node 120 drops below Vdd by one Vtp (where Vtp is the threshold voltage of transistor 110), transistor 110 turns on. Transistor 105, however, does not turn off until control node 120 voltage discharges to Vtn (where Vtn is the threshold voltage of transistor 105). Thus, a current path from Vdd to Vss exists through transistors 110, 104, 105, and 106 for a duration following clock going high when data is high. This "short circuit" current undesirably increase power consumption. Circuit 200 beneficially eliminates this short circuit current by decoupling the control of transistor 205 from control node 220. Thus, when D is high, transistor 205 is turned off by inverter 215 without regard to the voltage on node 220 thereby preventing the formation of a short circuit current.

Circuit 200 can be further optimized relative to circuit 100 by appropriate sizing of the transistors. In circuit 100 of FIG. 1, transistors 101 through 103 are generally larger (greater W/L) than transistors 104 through 106 to address the asymmetry problem. Larger transistors 101 through 103 reduce the control node 120 discharge time, but result in greater power consumption. Transistors 101 through 103 are generally roughly twice the size of transistors 104 through 106. In circuit 200, the capacitance on node 220 is less than the capacitance on node 120 and, therefore, transistors 201 and 202 can be reduced in size relative to transistors 101 and 102, without negatively affecting performance. In one embodiment, for example, transistors 201 and 202 have a W/L that is roughly 1.4 times the W/L of transistors 204 and 205. Thus, transistors 201 and 202 are small relative to transistors 101 and 102 resulting in reduced power consumption at a comparable performance level.

The embodiment of circuit 200 as depicted further includes an output stabilization circuit comprising a pair of back to back inverters 230 and 232 connected between output node 226 and output node 228. The stabilization circuit compensates for noise that may be present on output node 228. If noise such as a transient voltage spike is encountered on output node 228, the stabilization circuit will maintain the state of output node 226.

It will be apparent to those skilled in the art having the benefit of this disclosure that the present invention contemplates a symmetrical, high performance flip-flop circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A digital flip-flop circuit producing, at an output node, an output signal reflecting the state of a data signal when a clock signal changes logical states, comprising:
   a clock node for receiving the clock signal and a data node for receiving the data signal;
   a first output transistor comprising a source/drain terminal connected to the output node, wherein the first output transistor turns on to bring the output to a first state; and
   a second output transistor having opposite conductivity type of the first output transistor and having a source/drain terminal connected to the output node wherein the second output transistor turns on to bring the output node to a second state;
   a first control node connected to the gate of the first output transistor wherein the state of the first control node is determined by the clock signal and the data signal;
   a second control node, decoupled from the first control node, and connected to a gate terminal of the second output transistor;
   further comprising a first set of transistors, each having its respective pair of source/drain terminals connected between Vdd and the first control node.

2. The flip-flop circuit of claim 1, wherein the first output transistor is a p-channel transistor having a second source/drain terminal connected to Vdd and further wherein the first control node turns on the first output transistor to bring the output terminal high.

3. The flip-flop circuit of claim 1, further comprising a control inverter connected between the data node and the second control node.

4. The flip-flop circuit of claim 1, further comprising a set of inverters connected in series between the clock signal and a delayed clock signal node, wherein the signal on the delayed clock signal node comprises a complementary and time-delayed copy of the clock signal.

5. The flip-flop circuit of claim 1, further comprising a second set of transistors, each having respective source/drain terminals connected in series between the first control node and Vss, wherein one of the set of transistors is controlled by the clock signal and one of the transistors is controlled by the data signal.

6. The flip-flop circuit of claim 5, further comprising a third set of transistors having source/drain terminals connected in series between the output node and Vss, wherein a gate terminal of one of the third set of transistors is controlled by the second control node.

7. The flip-flop circuit of claim 6, wherein the second set of transistors and the third set of transistors share a common transistor, and wherein the common transistor is controlled by a delayed clock signal and is approximately twice as wide as the remaining transistors in the respective sets of transistors.

8. The flip-flop circuit of claim 1, wherein the first set of transistors includes a first p-channel transistor having a gate terminal connected to the data signal and a second p-channel signal having its gate terminal connected to the clock signal.

9. A digital flip-flop circuit, comprising:
   a data node for receiving a data signal;
   a clock node for receiving a clock signal;
   a first control node, having a state determined by the state of the data signal for an interval following a state transition of the clock signal, for controlling a first output transistor;
   a second control node, distinct from the first control node and having a state determined by the state of the data signal for an interval following a state transition of the clock signal, for controlling a second output transistor;
   wherein turning on the first output transistor during the interval pulls the output to a first logical state and turning on the second output transistor during the interval pulls the output to a second logical state; and
   wherein the data node is connected to the input of an inverter having an output connected to the second control node wherein the logical state of the second control node comprises the logical complement of the data signal.

10. The circuit of claim 9, wherein the logical state of the control node, during the interval, comprises the complement of the logical state of the input node and, during other times, comprises a precharge state.

11. The circuit of claim 10, wherein the precharge state of the control node turns off the first output transistor.

12. The circuit of claim 9, further comprising a third output transistor having source/drain terminal connected in series with source/drain terminals of the first and second output transistors and controlled by the logical state of the clock signal.

13. The circuit of claim 12, further comprising a fourth output transistor having source/drain terminals connected in series with source/drain terminals of the first, second, and third output transistors and controlled by the logical state of a delayed signal, wherein the delayed signal is a time delayed and logical complement of the clock signal.

14. The circuit of claim 13, wherein the control node is connected to source/drain terminals of first, second, and third precharge transistors each having its remaining source/drain terminal connected to a supply voltage.

15. The circuit of claim 14, further comprising first, second, and third control node transistors, having source/drain terminals connected in series between the control node and ground, wherein the gates of the control node transistors are controlled by the clock signal, the data signal, and the delayed signal respectively.

16. The circuit of claim 15, wherein the third control transistor and the fourth output transistor comprise a common transistor having a width/length ratio approximately twice that of the first and second control transistors.

17. The circuit of claim 9, wherein the logical state of the first control node is determined by the data signal during the interval and precharged to a predetermined state during other times while the logical state of the second control node is determined solely by the logical state of the data node.

18. The circuit of claim 9, further comprising first and second output inverters, the first output inverter having an input connected to the output node and an output connected to the input of the second inverter, the second output inverter having an output connected to the output node.

19. An integrated circuit comprising a plurality of circuits fabricated on a semiconductor substrate, wherein the plurality of circuits includes at least one flop flip circuit, the flip-flop circuit comprising:

a clock node for receiving a clock signal and a data node for receiving a data signal;

a first output transistor comprising a source/drain terminal connected to the output node, wherein the first output transistor turns on to bring the output to a first state;

a second output transistor having opposite conductivity type of the first output transistor and having a source/drain/terminal connected to the output node wherein the second output transistor turns on to bring the output node to a second state;

a first control node connected to the gate of a single transistor, wherein the single transistor is the first output transistor, wherein the state of the control node is determined by the clock signal and the data signal; and a second control node, decoupled from the first control node, and connected to a gate terminal of a single transistor, wherein the single transistor is the second output transistor.

* * * * *